United States Patent
Kumagai

[19]

[11] Patent Number: 6,103,406
[45] Date of Patent: Aug. 15, 2000

[54] MAGNETIC TUNNEL DEVICE

[75] Inventor: Seiji Kumagai, Miyagi, Japan

[73] Assignee: Sony Corporation, Tokyo, Japan

[21] Appl. No.: 09/090,671

[22] Filed: Jun. 4, 1998

[30] Foreign Application Priority Data

Jun. 6, 1997 [JP] Japan ................................ 9-149386

[51] Int. Cl.$^7$ ........................................ G11B 5/66
[52] U.S. Cl. ................ 428/692; 428/694 R; 428/694 T; 428/694 TS; 428/694 TM; 428/900; 360/113; 326/2
[58] Field of Search ............... 428/692, 694 R, 428/694 T, 694 TS, 694 TM, 900; 360/113; 326/2

[56] References Cited

U.S. PATENT DOCUMENTS 5,774,783  6/1998  Kaitsu ........................................ 428/546
5,789,088  8/1998  Nakai ........................................ 428/611

*Primary Examiner*—Leszek Kiliman
*Attorney, Agent, or Firm*—Hill & Simpson

[57] ABSTRACT

A novel magnetic tunnel device capable of displaying a magnetic tunnelling effect in stability and with high sensitivity even to an external magnetic field of a weak intensity. The magnetic tunnel device 1 has a layered structure including a first magnetic layer 2, a granular layer 3 layered on the first magnetic layer 2 and a second magnetic layer 4 layered on the surface of the granular layer 3 opposite to its surface carrying the first magnetic layer 2. The granular layer 3 has a granular structure which is made up of a magnetic metal phase 7 and an insulating phase 8. The first magnetic layer 2 and/or the second magnetic layer 4 of the magnetic tunnel device is formed of a ferromagnetic material having soft magnetic properties. The current is supplied in the layering direction of the layered structure.

4 Claims, 3 Drawing Sheets

MAGNETIC TUNNEL DEVICE

BACKGROUND OF THE INVENTION

1. Field of the invention

This invention relates to a magnetic tunnel device exploiting the magnetic tunnel effect. More particularly, it relates to a magnetic tunnel device having a granular thin film.

2. Related Art

In a three-layered structure comprised of a magnetic metal layer, an insulating layer and a magnetic metal layer, a magnetic tunnelling effect is observed if the insulating layer is tens of angstrom thick. The magnetic tunnelling effect signifies the phenomenon in which, if the voltage is applied across both magnetic metal layers, the conductance of the tunnel current flowing through both magnetic metal layers depends on the relative angle of magnetization of the magnetic metal layers.

With this magnetic tunnelling effect, the magnetic resistance ratio can be calculated from the rate of polarization of magnetization of the two magnetic metal layers. For example, an extremely high magnetic resistance ratio was estimated to be achieved with the use of Fe as a material for the magnetic metal layer.

Although this estimation was not realized for long, a resistance change ratio of approximately 18% was recently realized at ambient temperature with a three-layer structure of $Fe/Al_2O_3/Fe$, such that expectations are made not only of the mechanism of physical demonstration but also of application to new electromagnetic transducing elements.

In the above-mentioned three-layered structure comprised of the magnetic metal layer, insulating layer and the magnetic metal layer, basic investigations have barely been started as to formation of an insulating layer by spluttering oxidation in an oxygen atmosphere and formation of fine junctions by photolithography for producing a device. In the course of these investigations, the most serious problem has been the frequent occurrence of failure in producing resistance changes.

In the three-layered structure comprised of the magnetic metal layer, insulating layer and the magnetic metal layer, it is necessary for the tunnel current to flow between the two magnetic metal layers, such that it is necessary to reduce the film thickness of the insulating layer to a extremely small value. If the insulating layer is of an extremely small thickness, pinholes or the like defects are frequently produced in the insulating layer. If the insulation between the two magnetic metal layers is structurally destroyed, electrical leaks are generated to lead to cessation of the tunnel current.

That is, in the above-mentioned three-layered structure comprised of the magnetic metal layer, insulating layer and the magnetic metal layer, it is necessary to produce the insulating layer of a film thickness to permit the tunnel current to flow in a state free of defects, such as pinholes. If the conventional three-layer structure displaying the magnetic tunnelling effect is used as an electromagnetic transducer element, the magnetic tunnelling effect cannot be demonstrated due to occurrence of electric leakage.

SUMMARY OF THE INVENTION

It is therefore an object of the present invention to provide a novel magnetic tunnel device capable of demonstrating the magnetic tunnelling effect in stability and to high sensitivity against an external magnetic field of low intensity.

The present invention provides a novel magnetic tunnel device having a layered structure including a first magnetic layer, a granular layer layered on the first magnetic layer and a second magnetic layer layered on the surface of the granular layer opposite to its surface carrying the first magnetic layer. The granular layer has a granular structure which is made up of a magnetic metal phase and an insulating phase. The first magnetic layer and/or the second magnetic layer of the magnetic tunnel device is formed of a ferromagnetic material having soft magnetic properties. The current is supplied in the layering direction of the layered structure.

With the above-described magnetic tunnel device of the present invention, the tunnel current in the granular layer plays a predominant role in the current conduction between the first and second magnetic layers. With the present magnetic tunnel device, magnetization of the first and second magnetic layers is changed under the effect of an external magnetic field. The resistance to the tunnel current flowing the granular layer is changed at this time in dependence upon the relative angle of magnetization of the first and second magnetic layers.

Thus, for detecting the external magnetic field using this magnetic tunnel device, a pre-set current is allowed to flow in the layering direction to detect changes in resistance to the tunnel current in terms of voltage values of the flowing current. The relative angle between the magnetization of the first magnetic layer and that of the second magnetic layer is calculated on the basis of this voltage to detect the external magnetic field.

In the granular layer, the magnetic metal phase is present as magnetic metal particles in a dispersed state in the insulating phase. The tunnel current is allowed to flow across these magnetic metal particles. With the present magnetic tunnel device, the first magnetic layer and the second magnetic layer can be separated widely from each other so that electrical leakage is hardly produced.

By the granular layer is herein meant such a structure in which the magnetic metal phase is particulate and individual particles of the magnetic metal phase are surrounded in a net-like fashion by narrow grain boundaries formed of an insulating phase.

With the magnetic tunnelling device of the present invention, the resistance value to the tunnel current is changed depending on the relative angle between the first and second magnetic layers. This tunnel current flows through the granular layer between the first and second magnetic layers. Thus, with the present magnetic tunnelling device, the granular layer serves for completely insulating the first and second magnetic layers from each other. Thus, the magnetic tunnel device can demonstrate the magnetic tunnelling effect in stability.

Since it is the first magnetic layer and the second magnetic layer of the magnetic tunnel device that detect the external magnetic field, the magnetic tunnelling effect can be demonstrated in stability against the external magnetic field of weak intensity.

DESCRIPTION OF PREFERRED EMBODIMENTS

Figure 1:
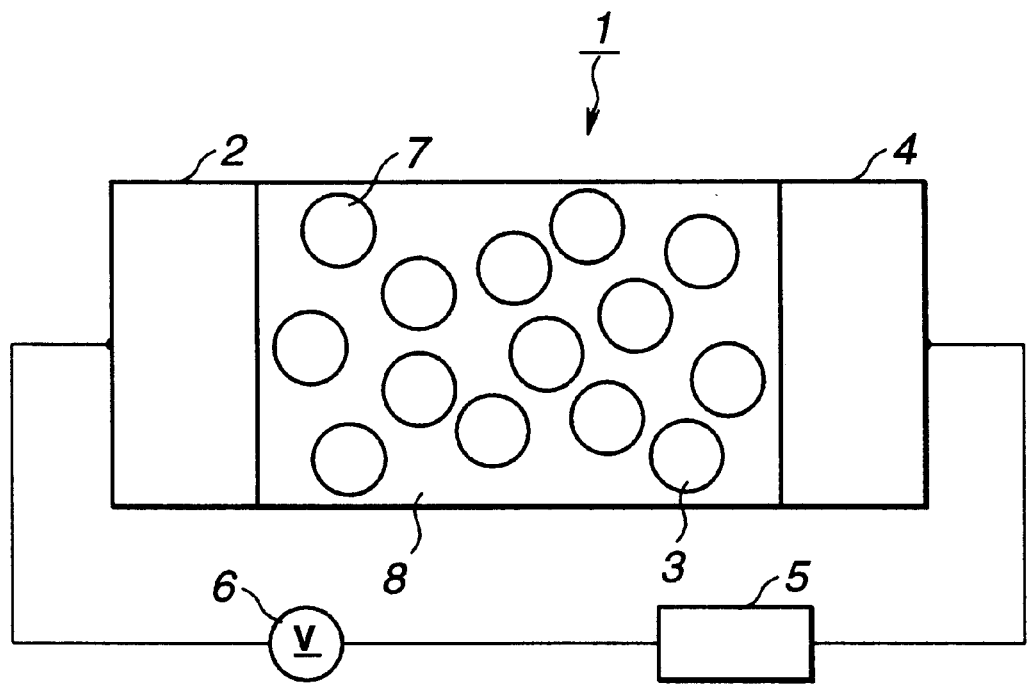
FIG. 1 is a schematic view showing a magnetic tunnel device according to the present invention.

Referring to the drawings, preferred embodiments of the magnetic tunnel device according to the present invention will be explained in detail.

FIG. 1 shows a magnetic tunnel device 1 of a preferred embodiment of the present invention. The magnetic tunnel device 1 includes a first magnetic layer 2, a granular layer 3 layered on this first magnetic layer 2 and which is made up of a magnetic metal phase and an insulating phase, and a second magnetic layer 4 layered on the surface of the granular layer 3 opposite to its surface carrying the first magnetic layer 2. That is, the magnetic tunnel device 1 is made up of the first magnetic layer 2, granular layer 3 and the second magnetic layer 4, layered in this order.

Also, the magnetic tunnel device 1 is configured so that the current will flow in the layering direction across the first magnetic layer 2 and the second magnetic layer 4. That is, with the present magnetic tunnel device 1, a constant-current source 5 is connected between the first magnetic layer 2 and the second magnetic layer 4 to constitute an electric circuit. A voltmeter 6 is also connected in the circuit in order to detect the voltage of the current flowing therein.

This first magnetic layer 2 and the second magnetic layer 4 are formed of a ferromagnetic material exhibiting soft magnetic characteristics. The ferromagnetic material exhibiting soft magnetic characteristics and which make up the first magnetic layer 2 and/or the second magnetic layer 4 may be enumerated by, for example, Ni—Fe, Fe—Al and Fe—Al—Si. According to the present invention, there is no particular limitation to the material, shape or film thickness of the first magnetic layer 2 or the second magnetic layer 4.

In the present embodiment, the first magnetic layer 2 and the second magnetic layer 4 are each formed of a ferromagnetic material having soft magnetic properties. The state of magnetization of each of the first magnetic layer 2 and the second magnetic layer 4 is varied due to the external magnetic field. With the present magnetic tunnel device 1, the magnetization of the first magnetic layer 2 has a pre-set angle relative to that of the second magnetic layer 4 under application of the external magnetic field.

More specifically, in order for the magnetization of the first magnetic layer 2 to have a pre-set angle relative to that of the second magnetic layer 4 under the effect of the external magnetic field, the first magnetic layer 2 is preferably formed to have coercivity different from that of the second magnetic layer 4. That is, with the magnetic tunnel device 1, since the first magnetic layer 2 has coercivity different from that of the second magnetic layer 4, the direction of magnetization of the first magnetic layer 2 differs from that of the second magnetic layer 4 in the presence of an external magnetic field of a pre-set magnitude.

Thus, the first magnetic layer 2 has a pre-set relative angle with respect to the second magnetic layer 4 responsive to the external magnetic field. With the present magnetic tunnel device 1, the first magnetic layer 2 has coercivity larger than that of the second magnetic layer 4.

The granular layer 3 is made up of a magnetic metal phase 7 and an insulating phase 8 and has a so-called granular structure. The granular structure means such a structure in which, if the amount of the magnetic metal phase 7 is approximately 50% with respect to that of the insulating phase 8, the magnetic metal phase 7 is present in a dispersed state in the insulating phase 8 as particles of 10 to 50 Å in size. Stated differently, the granular structure is such a structure in which the magnetic metal phase 7 in the particulate form is encircled in a reticular fashion by a grain boundary of narrow width comprised of the insulating phase 8. The magnetic metal phase 7 need only be ferromagnetic and may be enumerated by Co. The insulating phase 8, on the other hand, may be $Al_2O_3$, as an example. The present invention is not limited to the above-mentioned materials of the magnetic metal phase 7 or the insulating phase 8 and any suitable material may be used for the magnetic metal phase 7 or the insulating phase 8 provided that these materials permit the current to flow through the granular layer In general, if, in a granular thin film, made up of a metal phase and an insulating phase, a magnetic metal material is used as the metal phase, the magnetic tunnelling effect proper to the granular system is observed in which the tunnel current is changed in resistance against the external magnetic field. Recently, the resistance change ratio of approximately 8% has been achieved with the granular thin film.

This granular thin film is stirring up notice in that it can be fabricated more easily than the three-layer structure of the magnetic metal layer, insulating layer and the magnetic metal layer. The reason is that the granular thin film can be formed in its entirety to a thickness of the order of several to tens of nanometer such that it is unnecessary to realize an insulating layer of a extremely small thickness. This granular thin film, substantially equal in resistivity to the above-mentioned three-layered structure, is higher in resistance because it is several to tens of nanometer in thickness in its entirety. Moreover, since the granular thin film is increased in resistance due also to the internal insulating phase, eddy current losses can be reduced. Therefore, the granular thin film can be used asa magnetic material for high frequency use such as a magnetic material for GHz frequency domain.

However, with the above-described granular thin film, the external magnetic field applied needs to be of an extremely high intensity. Stated differently, if the external magnetic field is of an extremely high intensity, the granular thin film undergoes relatively large resistance changes in agreement with the external magnetic field. However, if the external magnetic field is of lower intensity, it hardly exhibits resistance changes, and hence cannot be used as an electromagnetic conversion device.

With the magnetic tunnel device 1, the present inventors have directed attention to the fact that the tunnel current flows in the granular thin film. Thus, the granular layer 3 is provided between the first magnetic layer 2 and the second magnetic layer 4.

With the above-described magnetic tunnel device 1 of the present invention, the external magnetic field can be detected by causing a pre-set current to flow along the layering direction of the first magnetic layer 2, granular layer 3 and the second magnetic layer 4.

Figure 2:
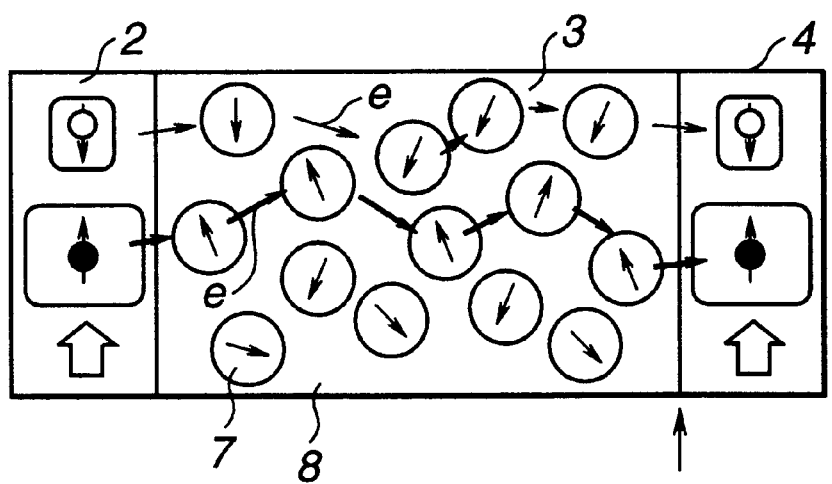
FIG. 2 is a schematic view showing a magnetic tunnel device for illustrating the flow of electrons in case magnetization of a first magnetic layer is oriented in the same direction as that of a second magnetic layer.
Figure 3:
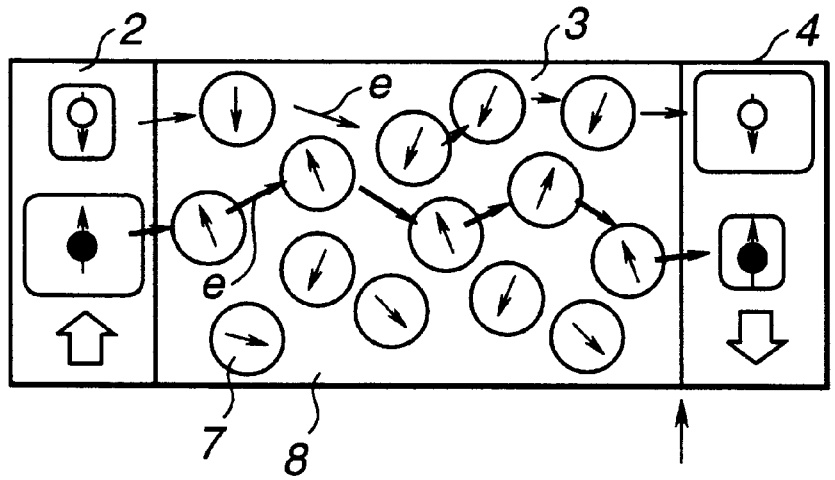
FIG. 3 is a schematic view showing a magnetic tunnel device for illustrating the flow of electrons in case magnetization of a first magnetic layer is oriented antiparallel to that of a second magnetic layer.
Figure 4:
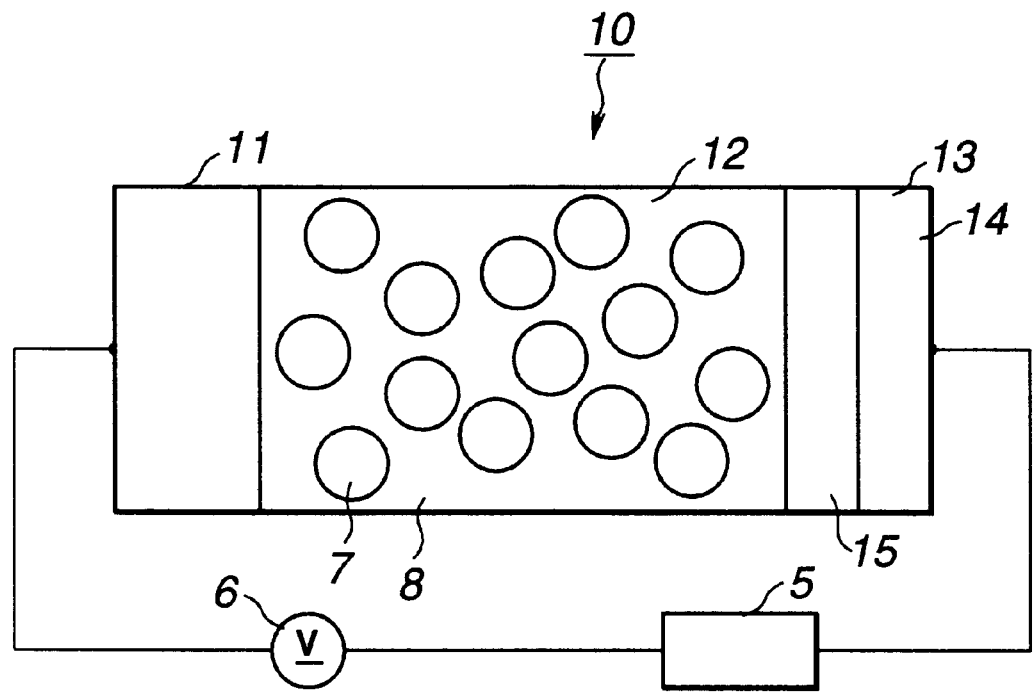
FIG. 4 is a schematic view showing a modification of a magnetic tunnel device according to the present invention.

For a case in which the direction of magnetization of the first magnetic layer 2 is the same as that of the second magnetic layer 4, as shown in FIG. 2, and for a case in which the direction of magnetization of the first magnetic layer 2 is opposite to that of the second magnetic layer 4, as shown in FIG. 3, the resistance value relative to the intensity of the flowing current is now investigated. In the first magnetic layer 2 and in the second magnetic layer 4 shown in FIGS. 2 and 3, arrow marks, arrows in square marks of larger size and arrows in square marks of a smaller size stand for the direction of spin, majority spin and minority spin, respectively. That is, with the first magnetic layer 2 and the second magnetic layer 4, the direction of majority spin represents the direction of magnetization.

Also, in FIGS. 2 and 3, since the current flows from the second magnetic layer 4 through the granular layer 3 towards the first magnetic layer 2, electrons flow via the granular layer 3 from the first magnetic layer 2 towards the second magnetic layer 4. At this time, electrons flow through the granular layer 3 as the tunnel current. It is assumed that spin of the electrons is free from flipping and that the spin in a pre-set direction shifts to the same state in the tunnelling process from the first magnetic layer 2 towards the second magnetic layer 4. That is, with the present magnetic tunnel device 1, it is assumed that the direction of spin of electrons flowing through the granular layer 3 is maintained.

If the current is supplied to this magnetic tunnel device 1, the electrons are migrated in the direction shown by arrow e in FIGS. 2 and 3, in which the granular magnetic metal phase 7 is indicated in circle marks in the granular layer 3 and the direction of magnetization of the magnetic metal phase 7 is indicated by arrows entered in the circle marks.

In FIG. 2, the electrons having the majority spin of the first magnetic layer 2 selectively flow as the tunnel current through the magnetic metal phase 7, oriented in substantially the same direction, to reach the second magnetic layer 4. Similarly, the electrons having the minority spin of the first magnetic layer 2 selectively flow as the tunnel current through the magnetic metal phase 7, oriented in substantially the same direction, to reach the second magnetic layer 4.

In this case, since the major portion of the electrons flowing through the granular layer 3 is oriented in substantially the same direction as the majority spin of the second magnetic layer 4, the electrons can easily flow through the majority spin of the first magnetic layer in the second magnetic layer 4. Therefore, if the majority spin of the first magnetic layer 2 is oriented in the same direction as the majority spin of the second magnetic layer 4, the electrons flowing through the second magnetic layer 4 encounters only a small resistance.

If the majority spin of the first substrate 2 is antiparallel to the majority spin of the second magnetic layer 4, as shown in FIG. 3, the majority spin and the minority spin of the first magnetic layer 2 flow as the tunnel current as in the case of FIG. 2.

However, in the case shown in FIG. 3, the majority spin in the first magnetic layer is the minority spin in the second magnetic layer 4, the electrons can hardly flow into the second magnetic layer. Therefore, if the majority spin of the first magnetic layer 2 is antiparallel relative to the majority spin of the second magnetic layer 4, the electrons flowing through the second magnetic layer encounters an increased resistance.

That is, with the magnetic tunnel device 1, the electrons meet the least and the maximum resistance when the magnetization of the first magnetic layer 2 is in the same direction as or antiparallel to that of the second magnetic layer 4, respectively.

With the above-described magnetic tunnel device 1, the resistance offered to the tunnel current flowing across the first magnetic layer 2 and the second magnetic layer 4 depends on the relative angle between the magnetization of the first magnetic layer 2 and that of the second magnetic layer 4. For realising changes of the resistance value offered to the tunnel current in this manner, it is necessary for the tunnel current to flow across the first magnetic layer 2 and the second magnetic layer 4. With the magnetic tunnel device 1, since the first magnetic layer 2 and the second magnetic layer 4 are layered with interposition of the granular layer 3, the tunnel current is allowed to flow reliably across the first magnetic layer 2 and the second magnetic layer 4.

According to the present invention, it suffices if the tunnel current is allowed to flow in the granular layer 3, there being no limitation to the thickness of the granular layer 3. Conversely, with the magnetic tunnel device of the three-layer structure of the magnetic metal layer, insulating layer and the magnetic metal layer, the tunnel current is not allowed to flow across the two magnetic metal layers unless the insulating layer is of the thickness of the order of tens of angstroms. Thus, with the conventional magnetic tunnel device, insulation across the two magnetic metal layers is difficult to realize because of the extremely thin thickness of the insulating layer.

With the magnetic tunnel device 1 according to the present invention, the tunnel current can be allowed to flow across the first magnetic layer 2 and the second magnetic layer 4 without limitations to the thickness of the granular layer 3. Thus, with the present magnetic tunnel device 1, the granular layer 3 can be designed with a sufficient thickness to assure reliable insulation across the first magnetic layer 2 and the second magnetic layer 4.

Moreover, with the present magnetic tunnel device 1, the relative angle between the first magnetic layer 2 and the second magnetic layer 4 is changed. Conversely, with the magnetic tunnel device, comprised of the granular thin film, magnetization of the magnetic metal phase in the granular thin film is changed with the external magnetic field to cause changes in the resistance offered to the tunnel current. In this case, the magnetic tunnel device comprised of the granular thin film is in need of an extremely large external magnetic field in order to exhibit resistance changes.

With the magnetic tunnel device 1 according to the present invention, the magnetization of the first magnetic layer 2 and that of the second magnetic layer 4 can be changed by an external magnetic field of a relatively low intensity, with there being no necessity of changing the magnetization of the granular layer 3. Stated differently, the magnetic tunnel device 1 of the present invention can exhibit changes in the resistance value to the tunnel current even with the external magnetic field of a relatively low strength.

With the above-described magnetic tunnel device 1, the first magnetic layer 2 has coercivity different from that of the second magnetic layer 4, such that the magnetization of the first magnetic layer 2 has a relative angle with respect to that of the second magnetic layer 4 depending on the external magnetic field. However, the present invention is not limited to this structure because it is only sufficient with the present invention if the magnetization of the first magnetic layer 2 has a relative angle with respect to that of the second magnetic layer 4 responsive to the external magnetic field.

That is, with a magnetic tunnel device 10, as a modification, includes a first magnetic layer 11, having soft magnetic characteristics, a granular layer 12 layered on this first magnetic layer 11, and a second magnetic layer 14 layered on this granular layer 12 and having an antiferromagnetic film 13. With the present magnetic tunnel device, the second magnetic layer 14 is made up of a magnetic film 15 of soft magnetic properties in contact with the granular layer 12 and the antiferromagnetic film 13 layered on the magnetic film 15.

Thus, with the present second magnetic layer 14, antiferromagnetic linkage occurs between the magnetic film 15 and the antiferromagnetic film 13 so that the direction of magnetization of the magnetic film 15 is fixed. That is, with the present magnetic tunnel device 10, the second magnetic layer 14 operates as a so-called pining layer the direction of magnetization of which is not changed with the external magnetic field. On the other hand, the first magnetic layer 11 of the present magnetic tunnel device 10 is formed of a ferromagnetic material exhibiting soft magnetic properties. Thus, the first magnetic layer 11 operates as a so-called free layer the direction of magnetization of which is changed with the external magnetic field.

That is, if an external magnetic field is applied across the magnetic tunnel device 10, the magnetization of the first magnetic layer 11 is changed, while that of the second magnetic layer 14 is not changed from a pre-set direction. Consequently, with the present magnetic tunnel device 10, the magnetization of the first magnetic layer 11 has a relative angle with respect to that of the second magnetic layer 14 responsive to the external magnetic field.

In the present magnetic tunnel device 10, the resistance offered to the tunnel current is changed by changes in the relative angle of magnetization. The external magnetic field is detected by these changes in resistance as in the case of the above-described magnetic tunnel device 1.

Figure 5:
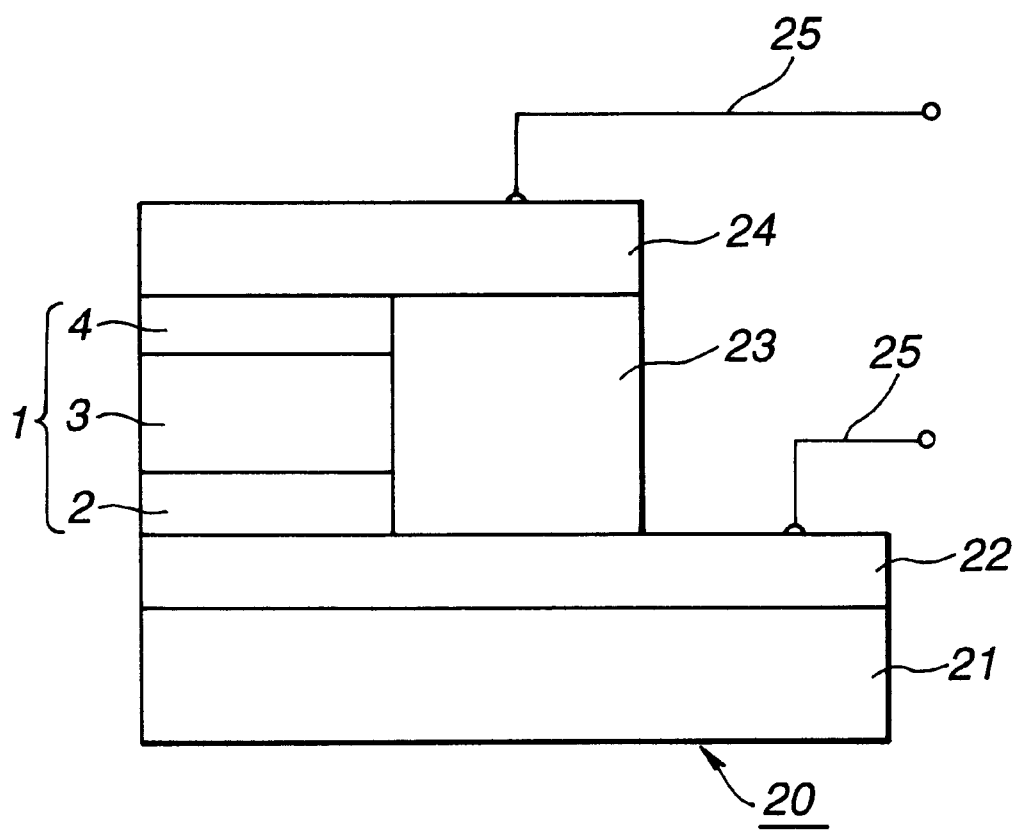
FIG. 5 is a schematic view showing a magnetic detection unit employing the magnetic tunnel device according to the present invention.

For actually detecting the external magnetic field using the above-described magnetic tunnel device 1 or 10, a magnetic detection device 20 configured as shown in FIG. 5 is prepared. In the following description, it is assumed that the magnetic tunnel device 1 is used as the magnetic detection device 20.

The magnetic detection device 20, shown in FIG. 5, includes a substrate 21, a first electrode 22, the magnetic tunnel device 1 and an insulating film 23, both formed on the first electrode 22, and a second electrode 24 formed on the magnetic tunnel device 1 and on the insulating film 23. In the present magnetic detection device 20, the magnetic tunnel device 1 is made up of the first magnetic layer 2, granular layer 3 and the second magnetic layer 4, as explained previously. In the present magnetic detection device 20, the first electrode 22 and the second electrode 24 are connected to a constant current source, not shown, and are supplied with pre-set current during operation of the magnetic detection device 20.

With the magnetic detection device 20, the substrate 21 is formed of a non-magnetic insulating material, such as Si. The substrate 21 may also have an oxide layer or an insulating layer on its surface for inhibiting electrical leakage.

In preparing the magnetic detection device 20, the first electrode 22 is first formed on the substrate 21. The first electrode 22 is formed of a metal material, such as Au, Cu or Al, having high electrical conductivity, and has a film thickness of approximately 100 Å. This first electrode 22 is formed asa metal film on substantially the entire surface of the substrate, using deposition techniques, such as vacuum deposition or electrical plating, and is subsequently trimmed to a desired shape by a method combined from photolithography and ion milling or flame plating.

The magnetic tunnel device 1 is then formed on this first electrode 22. In forming the magnetic tunnel device 1, a Ni—Fe film, with the content of 81 at % of Ni, which is to be the first magnetic layer 2, is deposited on the first electrode 22 by suitable deposition techniques, such as sputtering. The first magnetic layer 2 is formed by trimming this Ni—Fe film to a pre-set shape using trimming techniques, such as photolithography or ion milling.

The first magnetic layer 2 may also be a multi-layered film comprised of Ni—Fe with 81 at % of Ni contents and Co layered together. In this case, a multi-layer film is first formed and trimmed by trimming techniques, such as photolithography or ion milling, as in the case of the first magnetic layer 2.

The granular layer 3 then is deposited on this first magnetic layer 2. This granular layer 3 is formed by reactive sputtering of a CoAl alloy target in a mixed gas atmosphere of Ar and O2. That is, by this reactive sputtering, Al is oxidized by oxygen in the mixed gas to form $Al_2O_3$ to form the insulating phase 8. For reliably forming the granular structure, post-processing, such as annealing, may be performed on the deposited granular layer 3. The granular layer 3 may also be trimmed to the desired shape by trimming such as by photolithography or ion milling.

The second magnetic layer 4 is then formed on the granular layer 3. The second magnetic layer 4 may be deposited by forming a film of a high coercivity material, such as Co, by sputtering. The second magnetic layer 4 may be trimmed to the desired shape by trimming such as by photolithography or ion milling.

If the magnetic tunnel device 10 is used, the second magnetic layer 14 may be formed by deposition of the Ni-Fe film and the antiferromagnetic film, in this order, or by depositing a multi-layer film composed of FeMn, RhMn or NiMn, such as is used in a pinning layer in a spin bulb structure.

For assuring reliable insulation between the first magnetic layer 2 and the second magnetic layer 4 of the magnetic tunnel device 1, prepared as described above, the insulating film 23 then is formed. This insulating film 23 is formed by depositing an insulating material, such as $SiO_2$ or $Al_2O_3$, such as by sputtering. This insulating film 23 is trimmed to a pre-set shape such as by photolithography or ion milling.

The second electrode 24 then is formed on the second magnetic layer 4 and the insulating film 23 in the same way as the above-described first electrode 22. Similarly to the first electrode 22, this second electrode 24 is formed to a pre-set shape by a method combined from photolithography and ion milling or flame plating.

The first electrode 22 and the second electrode 24 are connected to a wiring 25 for connection to a current source or voltage detection means, not shown.

With the above-described magnetic detection device 20, the magnetization of the first magnetic layer 2 is changed responsive to the external magnetic field. The second magnetic layer 4 exhibits a constant direction of magnetization without regard to the external magnetic field. That is, with the present magnetic detection device 20, the magnetization of the first magnetic layer 2 has a pre-set relative angle with respect to the magnetization of the second magnetic layer 4 responsive to the external magnetic field.

The magnetic detection device 20 is fed with a pre-set constant current for detecting the external magnetic field. This constant current flows through the granular layer 3 between the first magnetic layer 2 and the second magnetic layer 4 as the tunnel current. With the present magnetic detection device 20, the resistance offered to the tunnel current is determined responsive to the relative angle of magnetization of the first magnetic layer 2 and the second magnetic layer 4.

Thus, if the constant current is supplied to the magnetic detection device 20, the resistance value to the tunnel current which is in agreement with the external magnetic field can be detected as the voltage value. Therefore, by supplying the constant current to the magnetic detection device 20 in case of changes in the external magnetic field, it is possible with the present magnetic detection device 20 to indicate changes in the external magnetic field as changes in voltage.

With the magnetic detection device 20, the granular layer 3 assures reliable insulation between the first magnetic layer 2 and the second magnetic layer 4, whilst the insulating film 23 assures more reliable insulation between the first magnetic layer 2 and the second magnetic layer 4. Thus, the tunnel current flows reliably between the first magnetic layer 2 and the second magnetic layer 4, with there being no risk of occurrence of electrical leakage across the first magnetic layer 2 and the second magnetic layer 4.

Also, with the present magnetic detection device 20, only the direction of magnetization of the first magnetic layer 2 is changed against the external magnetic field. Since the first magnetic layer 2 has superior soft magnetic properties, the direction of magnetization can be changed with high sensitivity against an external magnetic field of a small magnitude. Therefore, the magnetic detection device 20 can indicate changes in voltage value against small changes in the external magnetic field thus assuring highly sensitive detection of the external magnetic field.

What is claimed is:

1. A magnetic tunnel device comprising:

a first magnetic layer;

a granular layer layered on said first magnetic layer and having a granular structure composed of a magnetic metal phase and an insulating phase, with the tunnel current flowing across the magnetic metal phase and the insulating phase; and a second magnetic layer deposited on the surface of said granular layer opposite to its surface carrying the first magnetic layer;

said first magnetic layer and/or the second magnetic layer being formed of a ferromagnetic material having soft magnetic properties; with the current being supplied in the layering direction of a layered structure.

2. The magnetic tunnel device as claimed in claim 1 wherein said first magnetic layer and the second magnetic layer have different coercivities.

3. The magnetic tunnel device as claimed in claim 1 wherein an antiferromagnetic film is layered on the surface of said first magnetic layer or the second magnetic layer opposite to the surface carrying the granular layer.

4. The magnetic tunnel device as claimed in claim 1 wherein said first magnetic layer or the second magnetic layer is comprised of a multi-layer film made up of a magnetic film having soft magnetic properties and another magnetic film having hard magnetic properties, said magnetic films being layered together.

* * * * *